United States Patent
Lee et al.

(10) Patent No.: US 7,535,773 B2
(45) Date of Patent: May 19, 2009

(54) DATA OUTPUT BUFFER WHOSE MODE SWITCHES ACCORDING TO OPERATION FREQUENCY AND SEMICONDUCTOR MEMORY DEVICE HAVING THE SAME

(75) Inventors: Kyeong-Han Lee, Suwon-si (KR); Young-Joon Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 11/222,800

(22) Filed: Sep. 12, 2005

(65) Prior Publication Data
US 2006/0221722 A1 Oct. 5, 2006

(30) Foreign Application Priority Data
Apr. 4, 2005 (KR) .................. 10-2005-0027878

(51) Int. Cl.
*G11C 7/10* (2006.01)
(52) U.S. Cl. .................. 365/189.05; 365/191
(58) Field of Classification Search ............ 365/189.05, 365/191
See application file for complete search history.

(56) References Cited

U.S. PATENT DOCUMENTS

| | | | | |
|---|---|---|---|---|
| 5,488,580 A | * | 1/1996 | Park ................ | 365/189.15 |
| 6,012,122 A | * | 1/2000 | Choi et al. .............. | 711/105 |
| 6,094,376 A | * | 7/2000 | Park et al. ............ | 365/189.05 |
| 6,160,742 A | * | 12/2000 | Chung et al. .......... | 365/189.05 |
| 6,714,051 B2 | * | 3/2004 | Takiba et al. .................. | 326/86 |

FOREIGN PATENT DOCUMENTS

| | | |
|---|---|---|
| JP | 11144452 | 5/1999 |
| JP | 2003272394 | 9/2003 |
| JP | 2004086991 | 3/2004 |

* cited by examiner

*Primary Examiner*—Huan Hoang
*Assistant Examiner*—Kretelia Graham
(74) *Attorney, Agent, or Firm*—Volentine & Whitt, PLLC.

(57) ABSTRACT

A data output buffer switches it operating mode according to its operating frequency. The data output buffer includes a delay control unit, and a buffer unit. The buffer unit provides data of an internal buffer input line to an external buffer output line. The delay control unit generates a buffer enable signal corresponding to a received reference control signal. The buffer unit blocks the provision of the data to the buffer output line in response to a deactivation of the buffer enable signal. The buffer enable signal remains in an activated state when the period of the reference control signal is shorter than a reference period. The data output buffer may be included in a semiconductor memory device.

9 Claims, 6 Drawing Sheets

T1 : LONG PERIOD OF RCON
T2 : SHORT PERIOD OF RCON

T1 : LONG PERIOD OF RCON
T2 : SHORT PERIOD OF RCON

DATA OUTPUT BUFFER WHOSE MODE SWITCHES ACCORDING TO OPERATION FREQUENCY AND SEMICONDUCTOR MEMORY DEVICE HAVING THE SAME

BACKGROUND OF THE INVENTION

1. Field of the Invention

The present invention relates generally to a semiconductor memory device and, more particularly, to a data output buffer and a semiconductor device having the same. This application claims priority from Korean Patent Application No. 10-2005-0027878 filed on 4 Apr. 2005, the entirety of which is hereby incorporated herein for all purposes as if fully set forth herein.

2. Description of the Related Art

A data output buffer outputs data from the inside of a chip to the outside of the chip. Commonly, only the output terminal of the data output buffer is referred to as a "data output driver." As the operational speed of a semiconductor memory device increases, the data output buffer operates in a corresponding operating mode.

In general, the data output modes of a semiconductor memory device may be classified into a normal output mode and an Extended Data Out (EDO) mode. The normal output mode, as shown in FIG. 1, is an operating mode that outputs data from a buffer input line IDIO inside a chip to a buffer output line EDIO outside the chip in response to a reference control signal RCON. In the normal output mode, the provision of data from the inside of a chip to the outside of the chip starts in response to the leading edge of a reference control signal RCON. In contrast, the provision of data from the inside of the chip to the outside of the chip is blocked in response to the lagging edge of the reference control signal DCON. Accordingly, the normal output mode is advantageous in that, while the provision of data to the outside of the chip is being blocked, the buffer output line EDIO can be pre-charged or used for other purposes. Meanwhile, the normal output mode can be effectively used in the case where the operating period of the semiconductor memory device is relatively long (that is, the case of a low-frequency operating mode).

In contrast, the EDO mode, as shown in FIG. 2, is an operating mode that provides data from the buffer input line IDIO inside the chip to the buffer output line EDIO outside the chip regardless of the state of the reference control signal RCON. That is, in the EDO mode, as soon as data are received from the buffer input line IDIO inside the chip, the data are provided to the buffer output line EDIO. This EDO mode can be effectively used in the case where the operating period of the semiconductor memory device is relatively short (that is, the case of a high-frequency operating mode).

FIG. 3 is a block diagram showing a conventional data output buffer. In the data output buffer of FIG. 3, an operating mode is determined by an additionally provided mode selection signal MSEL. Accordingly, the conventional data output buffer has a problem in that it requires a structure for receiving the mode selection signal MSEL and for switching its operating based on the mode selection signal MSEL, so that the construction of a related circuit is complicated. Furthermore, in a semiconductor memory device containing the conventional data output buffer shown in FIG. 3, a separate circuit for generating the mode selection signal MSEL is required.

Accordingly, it would be desirable to provide a data output buffer whose operating mode can be controlled without a separate mode selection signal. It would also be desirable to provide a semiconductor memory device including such a data output buffer.

SUMMARY OF THE INVENTION

In one aspect of the invention, a data output buffer for providing data which are received from a buffer input line, to a buffer output line, comprises: a delay control unit adapted to generate a buffer enable signal in response to a received reference control signal, the buffer enable signal remaining in an activated state when a period of the reference control signal is shorter than a reference period; and a buffer unit adapted to provide the data of the buffer input line to the buffer output line, the buffer unit blocking provision of the data to the buffer output line in response to the buffer enable signal being deactivated.

In another aspect of the invention, a semiconductor memory device comprises: a memory array including a plurality of memory cells arranged in a matrix formed by rows and columns; an X-decoder for decoding a certain row address and, selecting a row of the memory array; an Y-decoder for decoding a certain column address and, selecting a column of the memory array; and a data output buffer adapted to output data of a buffer input line read from a memory cell of the memory array specified by the X-decoder and the Y-decoder to a buffer output line, the provision of data from the buffer input line to the buffer output line being blocked in response to a reference control signal, and being prevented from being blocked when a period of the reference control signal is shorter than a reference period.

In yet another aspect of the invention, a data output buffer for providing data which are received from a buffer input line, to a buffer output line, comprises: a delay control unit adapted to generate a buffer enable signal in response to a received reference control signal; and a buffer unit adapted to provide the data of the buffer input line to the buffer output line in response to the buffer enable signal being activated, and to block provision of the data to the buffer output line in response to the buffer enable signal being deactivated, wherein when a period of the reference control signal is longer than a reference period, then the buffer enable signal transitions to an activated state in response to the reference signal transitioning to a first logic level, and transitions to a deactivated state in delayed response to the reference signal transitioning to a second logic level, and wherein when a period of the reference control signal is shorter than a reference period, then the buffer enable signal remains in an activated state.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
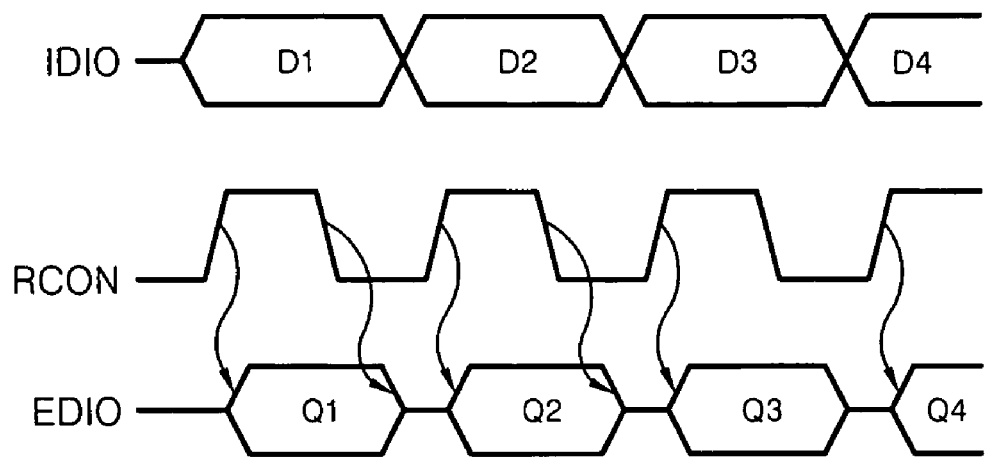
FIG. 1 is a timing diagram showing data output in a general normal output mode.
Figure 2:
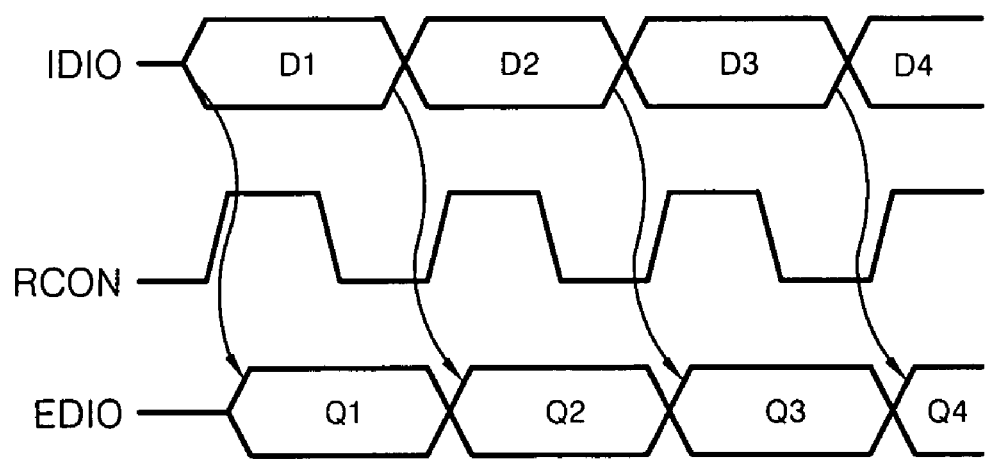
FIG. 2 is a timing diagram showing data output in a general EDO mode.
Figure 3:
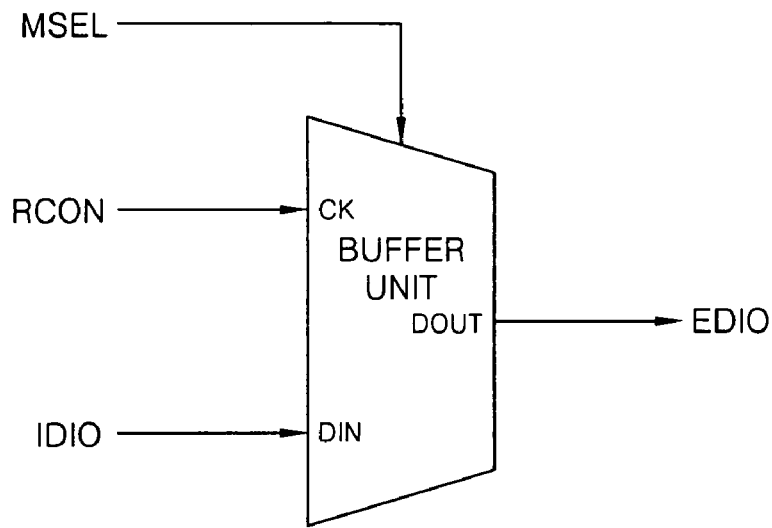
FIG. 3 is a block diagram showing a conventional data output buffer.

Reference now should be made to the drawings, in which the same reference numerals are used throughout the different drawings to designate the same or similar components.

The present invention is described in detail below by describing preferred embodiments of the present invention with reference to the accompanying drawings.

Figure 4:
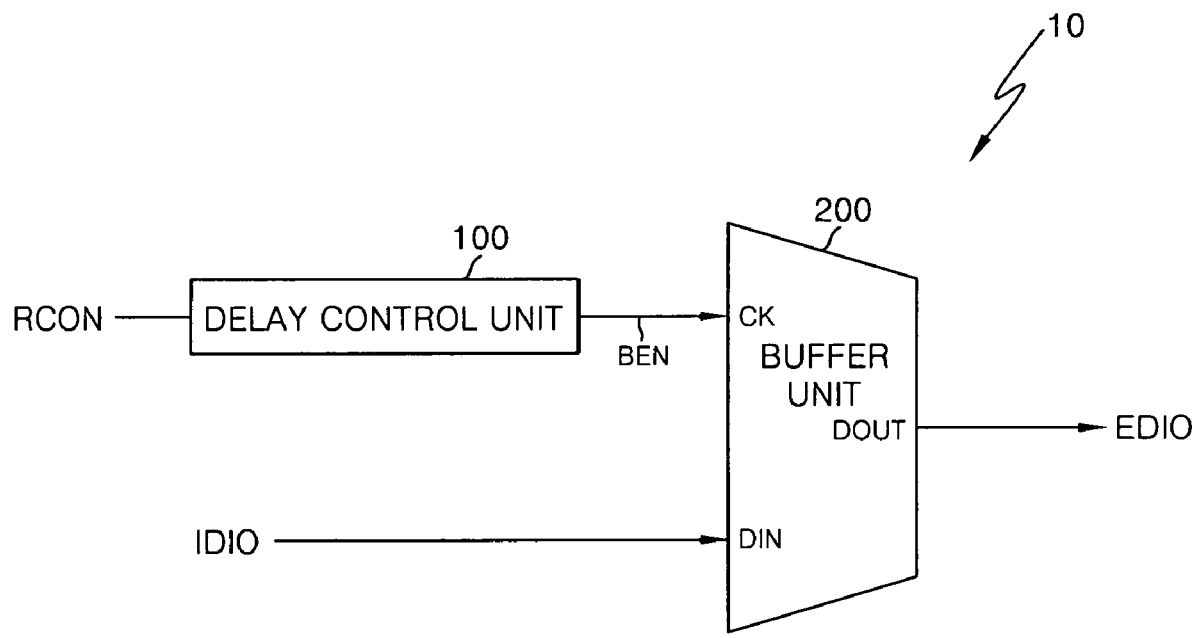
FIG. 4 is a diagram showing a data output buffer according to one or more aspects of the present invention.

FIG. 4 is a diagram showing a data output buffer 10. The data output buffer 10 performs control so that data can be provided from a buffer input line IDIO inside a chip to a buffer output line EDIO outside the chip.

Referring to FIG. 4, the data output buffer 10 includes a delay control unit 100 and a buffer unit 200. The delay control unit 100 generates a buffer enable signal BEN corresponding to a received reference control signal RCON. At this time, when the period of the reference control signal RCON is shorter than a predetermined reference period, the buffer enable signal BEN remains in an activation state (in the present embodiment, a logic "H" state).

Preferably, the buffer enable signal BEN is activated in response to the leading edge of the reference control signal RCON. Additionally, the buffer enable signal BEN is deactivated in delayed response to the lagging edge of the reference control signal RCON. However, when the period of the reference control signal RCON is shorter than the predetermined reference period, the deactivation of the buffer enable signal BEN is blocked.

Figure 5:
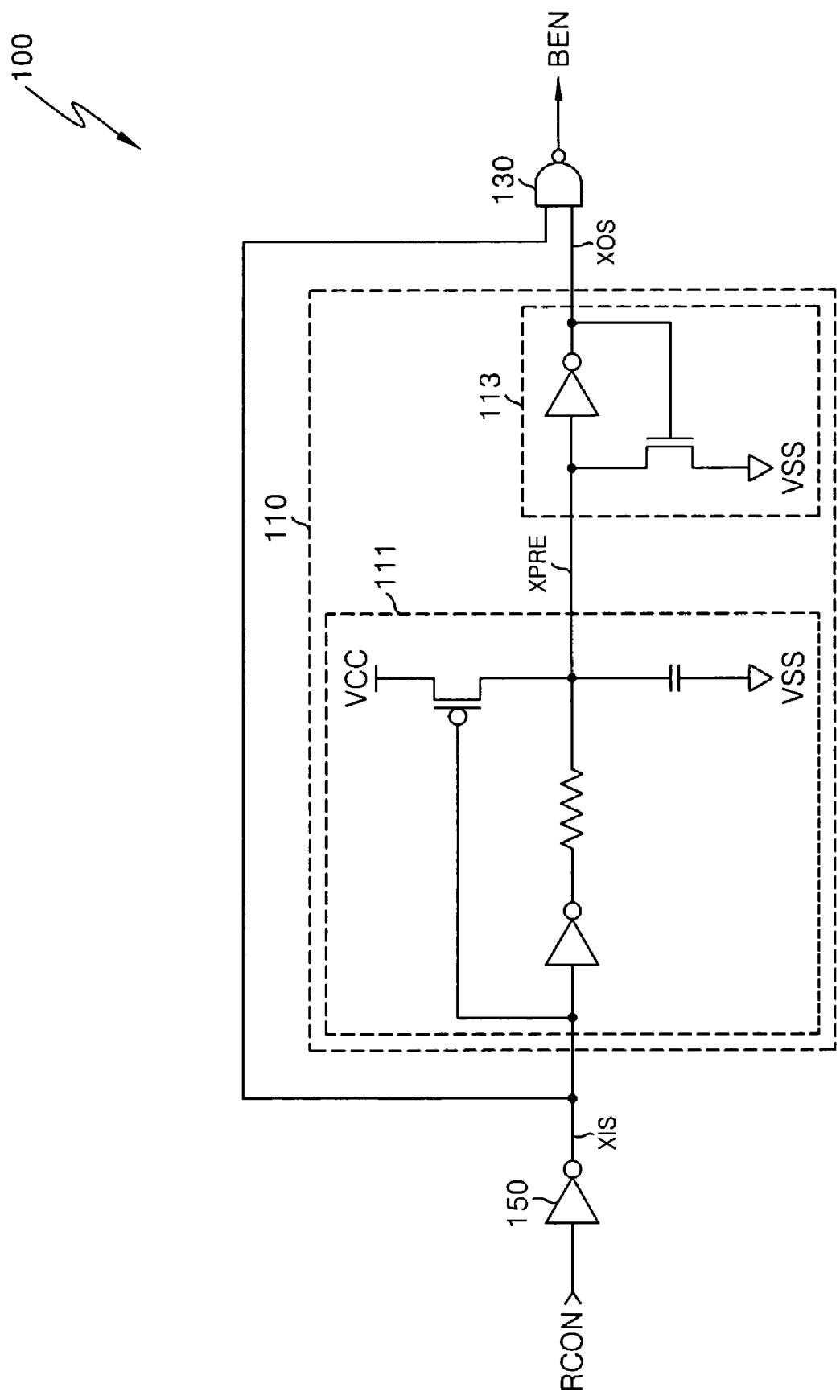
FIG. 5 is a detailed circuit diagram of one embodiment of the delay control unit of FIG. 4I.

FIG. 5 is a detailed circuit diagram showing an embodiment of the delay control unit 100 of FIG. 4. Referring to FIG. 5, the delay control unit 100 includes a unidirectional delay means 110 and a logical operation means 130.

The unidirectional delay means 110 generates an output auxiliary signal XOS in response to the leading edge of an input auxiliary signal XIS, which is linked to the reference control signal RCON. Additionally, the lagging edge of the output auxiliary signal XOS responds to the lagging edge of the input auxiliary signal XIS in a delayed manner.

In the present embodiment, the input auxiliary signal XIS is the inverted reference control signal RCON. Accordingly, the leading edge of the input auxiliary signal XIS is a falling edge, and is generated in response to the leading edge of the reference control signal RCON (in the present embodiment, in response to a rising edge of the reference control signal RCON).

The unidirectional delay means 110 includes a unidirectional delay element 111 and latch element 113. The unidirectional delay element 111 generates a preparatory signal XPRE in response to the leading edge of the input auxiliary signal XIS. Meanwhile, the lagging edge of the preparatory signal XPRE responds to the lagging edge of the input auxiliary signal XIS in a delayed manner. The latch element 113 latches the preparatory signal XPRE and, ultimately, generates the output auxiliary signal XOS.

Meanwhile, the logical operation means 130 performs an AND operation on the input auxiliary signal XIS and the output auxiliary signal XOS and, ultimately, generates the buffer enable signal BEN. In the present embodiment, the logical operation means 130 is implemented using a NAND gate.

Figure 6:
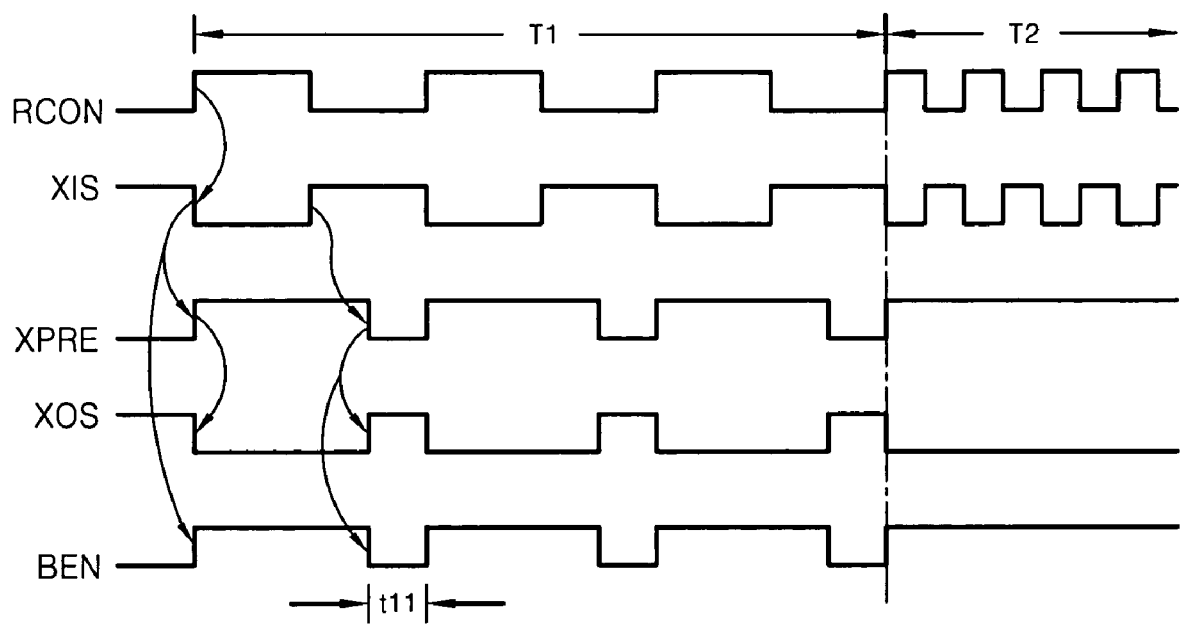
FIG. 6 is a timing diagram for principal signals in the delay control unit of FIG. 5.

FIG. 6 is a timing diagram for principal signals in the delay control unit 100 of FIG. 5, which indicates that the deactivation of the buffer enable signal BEN is blocked when the period of the reference control signal RCON is shorter than the certain reference period. In FIG. 6, interval T1 indicates the case where the period of the reference control signal RCON is longer than a reference period, and interval T2 indicates that the period of the reference control signal RCON is shorter than the reference period.

With reference to FIGS. 5 and 6, the operation and effect of the delay control unit 100 are described. The operation in interval T1 is described first. The input auxiliary signal XIS results from the inversion of the reference control signal RCON. Now, the transition of the preparatory signal XPRE to a high logic level "H" is made in response to the transition of the input auxiliary signal XIS to a low logic level "L" (which, in turn, occurs in response to the leading edge of the reference control signal RCON). Meanwhile, the transition of the preparatory signal XPRE to the low logic level "L" is made in delayed response to the transition of the input auxiliary signal XIS to the high logic level "H", (which, in turn, occurs in response to the lagging edge of the reference control signal RCON). That is, the preparatory signal XPRE transitions to the low logic level "L" in response to the input auxiliary signal XIS transitioning to the high logic level "H," but only after a certain delay time occurs. Furthermore, the output auxiliary signal XOS is the inverted preparatory signal XPRE.

As a result, in interval T1, the buffer enable signal BEN is activated to the high logic level "H" in response to the transition of the reference control signal RCON to the high logic level "H", and is deactivated to the low logic level "L" in delayed response to the transition of the reference control signal RCON to the low logic level "L". Accordingly, in the case of interval T1, a period t11, in which the buffer enable signal BEN has been deactivated, occurs.

Meanwhile, the operation in interval T2 is described below. Before the preparatory signal XPRE makes a transition to the low logic level "L" in delayed response to the input auxiliary signal XIS transitioning to the high logic level "H," the input auxiliary signal XIS makes a transition back to the low logic level "L" again. Accordingly, the transition of the preparatory signal XPRE to the low logic level "L" does not occur. As a result, the transition of the buffer enable signal BEN to the low logic level "L" does not occur either, and the buffer enable signal BEN remains in an activated state at the high logic level "H".

Referring to FIG. 4 again, the buffer unit 200 provides data from the buffer input line IDIO to the buffer output line EDIO while the buffer enable signal BEN is in the state of having been activated to the high logic level "H". Furthermore, the provision of data to the buffer output line EDIO is blocked in response to the deactivation of the buffer enable signal BEN to the low logic level "L".

Beneficially, the buffer unit 200 provides data, which are obtained by performing an AND operation on the buffer enable signal BEN and the data of the buffer input line IDIO, ultimately to the buffer output line EDIO. More beneficially, the buffer unit 200 is an AND gate that performs an AND operation on the buffer enable signal BEN and the data of the buffer input line IDIO and provides the result of the AND operation to the buffer output line EDIO.

Figure 7:
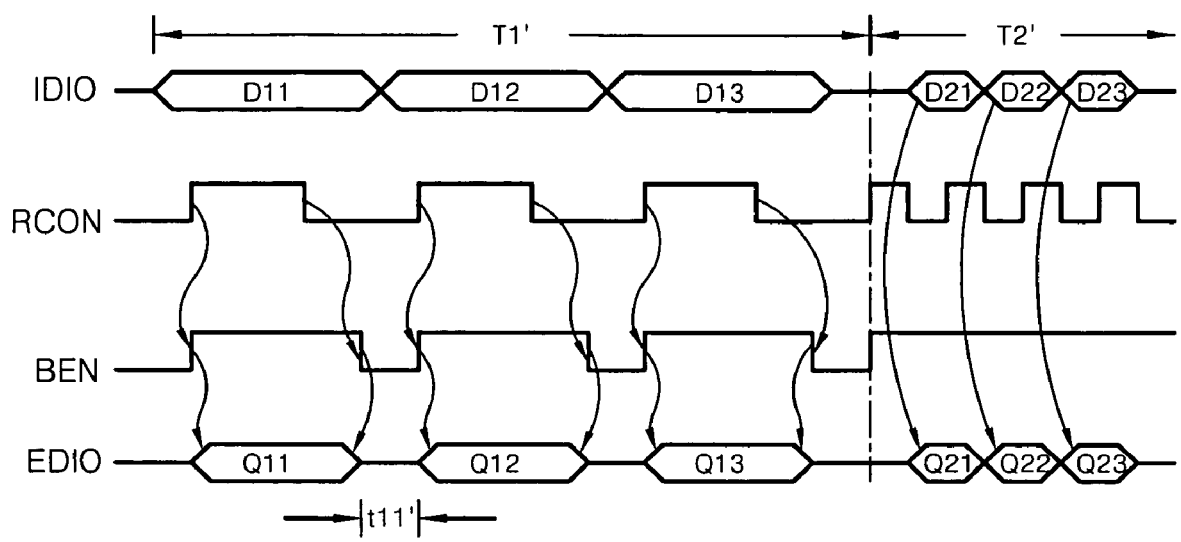
FIG. 7 is a timing diagram illustrating a process of data output in the data output buffer of FIG. 4.

FIG. 7 is a timing diagram illustrating a process of inputting data in the data output buffer 10 of FIG. 4. As described above, in the case of interval T1' in which the period of the reference control signal RCON is longer than the certain reference period, section t11', in which the buffer enable signal BEN has been inactivated to the low logic level "L", occurs.

Accordingly, in interval T1', the provision of data from the inside of the chip to the outside of the chip starts in response to the leading edge of the reference control signal RCON. Furthermore, in response to the lagging edge of the reference control signal RCON, the provision of data from the inside of the chip to the outside of the chip is blocked. That is, in interval T1', the data output buffer 10 operates in a 'normal output mode' of outputting data from the buffer input line IDIO inside the chip to the buffer output line EDIO outside the chip in response to the reference control signal RCON. In interval T1', during the period t11' the buffer output line EDIO outside the chip may be pre-charged or used for other purposes while the provision of data to the outside of the chip is in the state of having been blocked.

In contrast, in the case of interval T2' in which the period of the reference control signal RCON is shorter than the certain reference period, the buffer enable signal BEN retains the state of having been activated to the high logic level "H". Accordingly, in interval T2', the data output buffer 10 operates in an "EDO mode" of providing data to the buffer output line EDIO outside the chip as soon as the data are received from the buffer input line IDIO inside the chip, regardless of the state of the reference control signal RCON.

In the data output buffer 10 the operating mode switches according to the period (frequency) of the reference control signal RCON, even though the mode selection signal is not provided. In other words, the data output buffer 10 operates in the 'normal output mode' when the operation period is long, that is, when the data output buffer 10 operates at a low frequency, whereas the data output buffer 10 operates in the 'EDO mode' when the operation period is short, that is, when the data output buffer 10 operates at a high frequency. Accordingly, the data output buffer can be implemented as a considerably simple construction, compared to the conventional data output buffer.

Figure 8:
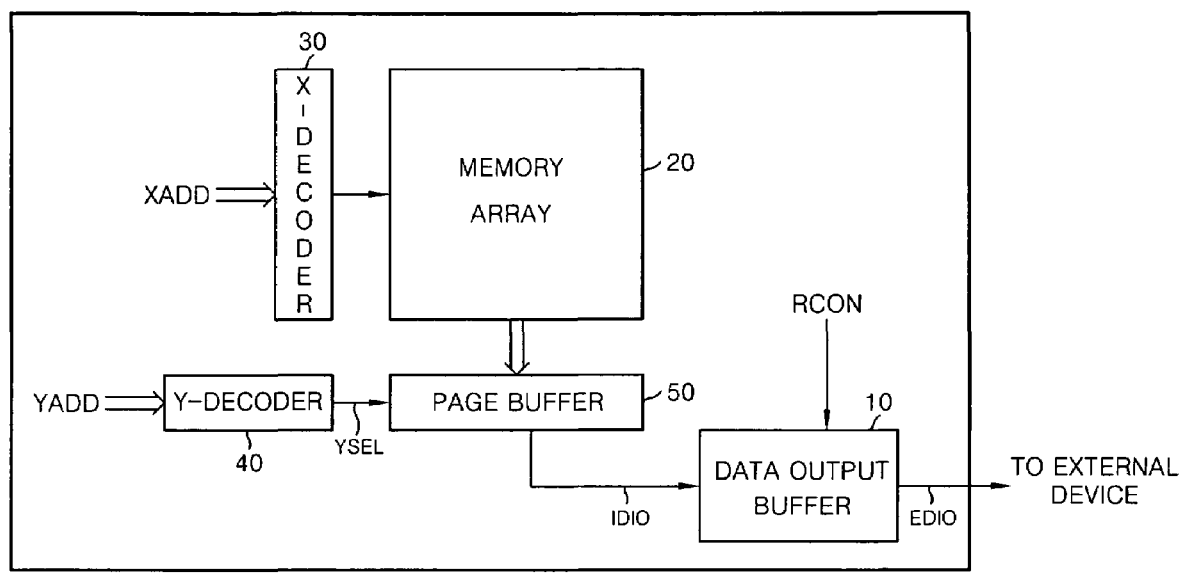
FIG. 8 is a semiconductor memory device in which the data output buffer of FIG. 4 is included.

Meanwhile, the data output buffer 10 may be usefully applied to the semiconductor memory device shown in FIG. 8. Referring to FIG. 8, the semiconductor memory device includes a data output buffer 10, a memory array 20, an X-decoder 30 and an Y-decoder 40.

The memory array 20 includes a plurality of memory cells in a matrix that is formed by rows and columns. The X-decoder 30 decodes a certain row address XADD and selects a row of the memory array 20. The Y-decoder 40 decodes a certain column address YADD and, ultimately, selects a column of the memory array 20.

The data output buffer 10 controls the data of the buffer input line IDIO read from the memory cell of the memory array 20 specified by the X-decoder 30 and the Y-decoder 40, and provides the data to the buffer output line EDIO. Furthermore, in the data output buffer 10, the provision of data from the buffer input line IDIO to the buffer output line EDIO may be blocked in response to the certain reference control signal RCON as described above, but the provision of the data is prevented from being blocked when the period of the reference control signal RCON is shorter than an established reference period.

Preferably, the semiconductor memory device of FIG. 8 is flash memory further including a page buffer 50. The page buffer 50 latches data read from the memory array 20. Furthermore, the data latched by the page buffer 50 are provided to the data output buffer 50 in response to a row selection signal YSEL provided from the Y-decoder 40.

The semiconductor memory device shown in FIG. 8 contains a data output buffer 10 whose operating mode switches according to frequency. Accordingly, the semiconductor memory device does not need to contain an additional circuit for generating a mode selection signal selecting one from among the EDO mode and the normal output mode. Accordingly, the construction of the semiconductor memory device can be considerably simplified.

In the data output buffer as disclosed above, the operating mode of the data output buffer switches according to the period of the reference control signal RCON even though no mode selection signal is additionally provided. That is, the data output buffer operates in the 'normal output mode' when the operation period of the reference control signal RCON is long, and operates in the 'EDO' mode when the operation period is short. Accordingly, the data output buffer can be implemented as a considerably simple construction, compared to the conventional data output buffer.

Furthermore, the semiconductor memory device containing the data output buffer as disclosed above does not need to contain an additional circuit for generating a mode selection signal selecting one of the EDO mode and the normal output mode. Accordingly, the semiconductor memory device can also be implemented as a considerably simple construction.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A data output buffer for providing data which are received from a buffer input line, to a buffer output line, the data output buffer comprising:
   a delay control unit adapted to generate a buffer enable signal in response to a received reference control signal; and
   a buffer unit adapted to provide the data of the buffer input line to the buffer output line, the buffer unit blocking provision of the data to the buffer output line in response to the buffer enable signal being deactivated,
   wherein the buffer enable signal is activated in response to a leading edge of a reference signal and deactivated in response to a lagging edge of the reference control signal when the period of the reference control signal is longer than a reference period, and the deactivation of the buffer enable signal is blocked to remain an activated state when the period of the reference control signal is shorter than the reference period.

2. The data output buffer of claim 1, wherein the buffer unit is adapted to perform a logic operation on the buffer enable signal and the data of the buffer input line and to provide an output of the logic operation, to the buffer output line.

3. The data output buffer of claim 1, wherein the delay control unit comprises:
   unidirectional delay means for generating an output auxiliary signal in response to a leading edge of an input auxiliary signal produced from the reference control signal, a lagging edge of the output auxiliary signal responding to a lagging edge of the input auxiliary signal in a delayed manner; and
   logical operation means for generating the buffer enable signal by performing an AND operation on the input auxiliary signal and the output auxiliary signal.

4. The data output buffer of claim 3, wherein the unidirectional delay means comprises:
   a unidirectional delay element adapted to generate a preparatory signal in response to a leading edge of the input auxiliary signal, a lagging edge of the preparatory signal responding to the lagging edge of the input auxiliary signal in a delayed manner; and
   a latch element for latching the preparatory signal.

5. A semiconductor memory device, comprising:
   a memory array including a plurality of memory cells arranged in a matrix formed by rows and columns;
   an X-decoder for decoding a certain row address and, selecting a row of the memory array;
   an Y-decoder for decoding a certain column address and, selecting a column of the memory array; and
   a data output buffer adapted to output data of a buffer input line read from a memory cell of the memory array specified by the X-decoder and the Y-decoder to a buffer output line, the provision of data from the buffer input line to the buffer output line being blocked in response to a reference control signal, and being prevented from being blocked when a period of the reference control signal is shorter than a reference period,
   wherein the data output buffer comprises:
   a delay control unit adapted to generate a buffer enable signal in response to the reference control signal; and
   a buffer unit adapted to provide the data of the buffer input line to the buffer output line, the buffer unit blocking the provision of the data to the buffer output line in response to deactivation of the buffer enable signal,
   wherein the buffer enable signal is activated in response to a leading edge of a reference signal and deactivated in response to a lagging edge of the reference control signal when the period of the reference control signal is longer than a reference period, and the deactivation of the buffer enable signal is blocked to remain an activated state when the period of the reference control signal is shorter than the reference period.

6. The semiconductor memory device of claim 5, wherein the buffer unit is adapted to perform a logic operation on the buffer enable signal and the data of the buffer input line and to provide an output of the logic operation, to the buffer output line.

7. The semiconductor memory device of claim 5, wherein the delay control unit comprises:
   unidirectional delay means for generating an output auxiliary signal in response to a leading edge of an input auxiliary signal produced from the reference control signal, a lagging edge of the output auxiliary signal responding to a lagging edge of the input auxiliary signal in a delayed manner; and
   logical operation means for generating the buffer enable signal by performing an AND operation on the input auxiliary signal and the output auxiliary signal.

8. The semiconductor memory device of claim 7, wherein the unidirectional delay means unit comprises:
   a unidirectional delay element adapted to generate a preparatory signal in response to a leading edge of the input auxiliary signal, a lagging edge of the preparatory signal responding to the lagging edge of the input auxiliary signal in a delayed manner; and
   a latch element for latching the preparatory signal.

9. The semiconductor memory device of claim 5, wherein the semiconductor memory device is flash memory.

* * * * *